(12) United States Patent
Ahne

(10) Patent No.: US 7,259,588 B2
(45) Date of Patent: Aug. 21, 2007

(54) TRI-STATE DETECTION CIRCUIT FOR USE IN DEVICES ASSOCIATED WITH AN IMAGING SYSTEM

(75) Inventor: Adam Jude Ahne, Lexington, KY (US)

(73) Assignee: Lexmark International Inc., Lexington, KY (US)

( * ) Notice: Subject to any disclaimer, the term of this patent is extended or adjusted under 35 U.S.C. 154(b) by 540 days.

(21) Appl. No.: 10/629,008

(22) Filed: Jul. 29, 2003

(65) Prior Publication Data

US 2005/0057980 A1    Mar. 17, 2005

(51) Int. Cl.
*H03K 19/02* (2006.01)
(52) U.S. Cl. .......................................... 326/56; 326/82
(58) Field of Classification Search .................. 326/82, 326/83, 86, 90, 56–58
See application file for complete search history.

(56) References Cited

U.S. PATENT DOCUMENTS

| | | | |
|---|---|---|---|
| 4,612,638 A | 9/1986 | Kissel | |
| 4,725,982 A | 2/1988 | Hara et al. | |
| 5,253,934 A * | 10/1993 | Potucek et al. | 347/237 |
| 5,371,423 A | 12/1994 | Berthold et al. | |
| 5,373,202 A | 12/1994 | Armstrong, II | |
| 5,432,440 A * | 7/1995 | Bartlett | 324/158.1 |
| 5,572,706 A | 11/1996 | Matsumoto | |
| 5,592,595 A | 1/1997 | Wakabayashi et al. | |
| 5,598,110 A * | 1/1997 | Chang | 326/60 |
| 5,969,540 A * | 10/1999 | Hwang | 326/56 |
| 6,028,443 A * | 2/2000 | Ozaki | 326/16 |
| 6,106,172 A | 8/2000 | No | |
| 6,133,753 A | 10/2000 | Thomson et al. | |
| 6,154,056 A | 11/2000 | Casper | |
| 6,163,169 A | 12/2000 | Lawson | |
| 6,300,800 B1 | 10/2001 | Schmitt et al. | |
| 6,371,588 B1 * | 4/2002 | Tsuruoka | 347/12 |
| 6,484,295 B1 | 11/2002 | McBride et al. | |
| 6,515,885 B1 | 2/2003 | Casper | |
| 2002/0180851 A1 | 12/2002 | Saruta | |
| 2002/0191052 A1 | 12/2002 | Hirayama et al. | |
| 2003/0025525 A1 | 2/2003 | Strazalkowski | |

FOREIGN PATENT DOCUMENTS

| | | |
|---|---|---|
| JP | 60062234 | 10/1985 |
| JP | 62262515 | 11/1987 |

* cited by examiner

*Primary Examiner*—Don Le
(74) *Attorney, Agent, or Firm*—Taylor & Aust, PC

(57) ABSTRACT

A tri-state detection circuit includes a first input port for receiving a tri-state input signal, a clock input port for receiving a clocking signal, a first output port, a second output port coupled to the first input port, a D-flip-flop and a buffer. The D-flip-flop has a D input, a clock input CLK, and a Q output. The D input is tied high. The clock input CLK is coupled to the first input port. The Q output is coupled to the first output port. The buffer has a buffer input and a buffer output. The buffer input is coupled to the clock input port. The buffer output is coupled to the clock input CLK of the D-flip-flop.

12 Claims, 4 Drawing Sheets

| OUT1 | OUT2 | PIN |
|------|------|----------|
| 1    | X    | FLOATING |
| 0    | 1    | 1        |
| 0    | 0    | 0        |

TRI-STATE DETECTION CIRCUIT FOR USE IN DEVICES ASSOCIATED WITH AN IMAGING SYSTEM

BACKGROUND OF THE INVENTION

1. Field of the Invention

The present invention relates to an imaging system, and, more particularly, to a tri-state detection circuit that may be used, for example, in devices associated with an imaging system.

2. Description of the Related Art

A tri-state detection circuit accommodates the detection of tri-state signals having three possible signal levels, or states: a logic high (1) level, a logic low (0) level, and a floating (high-impedance) level. It is known to employ tri-state signals in conventional binary logic circuits. Tri-state input signals increase the amount of information that can be conveyed into a receiving circuit for a given number of inputs. For example, in a conventional binary receiving circuit, each input and/or output is allowed to be either a zero or a one. Assuming that the binary receiving circuit has two inputs, the binary receiving circuit provides a total of four possible input combinations. However, if the two input receiving circuit is capable of detecting the three states of a tri-state signal, then a total of nine input combinations are possible.

Several circuits have been developed to detect the state of a tri-state input signal. Typically, however, such circuits require a relatively large number of components for successful implementation, which in turn occupies a considerable amount of area on an integrated circuit substrate and increases power consumption.

What is needed in the art is a tri-state detection circuit that can be configured with a minimal number of components.

SUMMARY OF THE INVENTION

The present invention provides a tri-state detection circuit that can be configured with a minimal number of components.

The invention, in one form thereof, relates to a tri-state detection circuit. The tri-state detection circuit includes a first input port for receiving a tri-state input signal, a clock input port for receiving a clocking signal, a first output port, a second output port coupled to the first input port, a D-flip-flop and a buffer. The D-flip-flop has a D input, a clock input CLK, and a Q output. The D input is tied high. The clock input CLK is coupled to the first input port. The Q output is coupled to the first output port. The buffer has a buffer input and a buffer output. The buffer input is coupled to the clock input port. The buffer output is coupled to the clock input CLK of the D-flip-flop.

In another form thereof, the invention relates to an electronic apparatus having a tri-state detection circuit used in facilitating communications with another electronic apparatus. The tri-state detection circuit includes a first input port, a clock input port, a first output port, a second output port, a D-flip-flop and a buffer. The D-flip-flop has a D input, a clock input CLK, and a Q output. The D input is tied high. The clock input CLK is connected to the first input port. The Q output is connected to the first output port. The buffer has a buffer input and a buffer output. The buffer input is connected to the clock input port. The buffer output is connected to the clock input CLK of the D-flip-flop, the buffer output is connected to the first input port, and the buffer output is connected to the second output port.

In still another form thereof, the invention is related to a supply item including a circuit. The circuit includes a tri-state input port. The supply item has at least three modes of operation. A particular mode of operation of the at least three modes of operation is selected based on a signal level of a tri-state input signal supplied to the tri-state input port.

In yet another form thereof, the invention is related to an imaging apparatus including a controller and a supply item. The supply item includes a circuit having a tri-state input port coupled to the controller. The supply item has at least three modes of operation. A particular mode of operation of the at least three modes of operation is selected based on a signal level of a tri-state input signal supplied to the tri-state input port by the controller.

An advantage of the present invention is that a tri-state detection circuit can be configured with a minimal number of components, e.g., with one D-flip-flop and one buffer.

Another advantage is that by accommodating tri-state signals that are detected by the tri-state detection circuit of the present invention, the number of connections between two electronic apparatus can be reduced, while conveying the same amount of information.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

Figure 1:
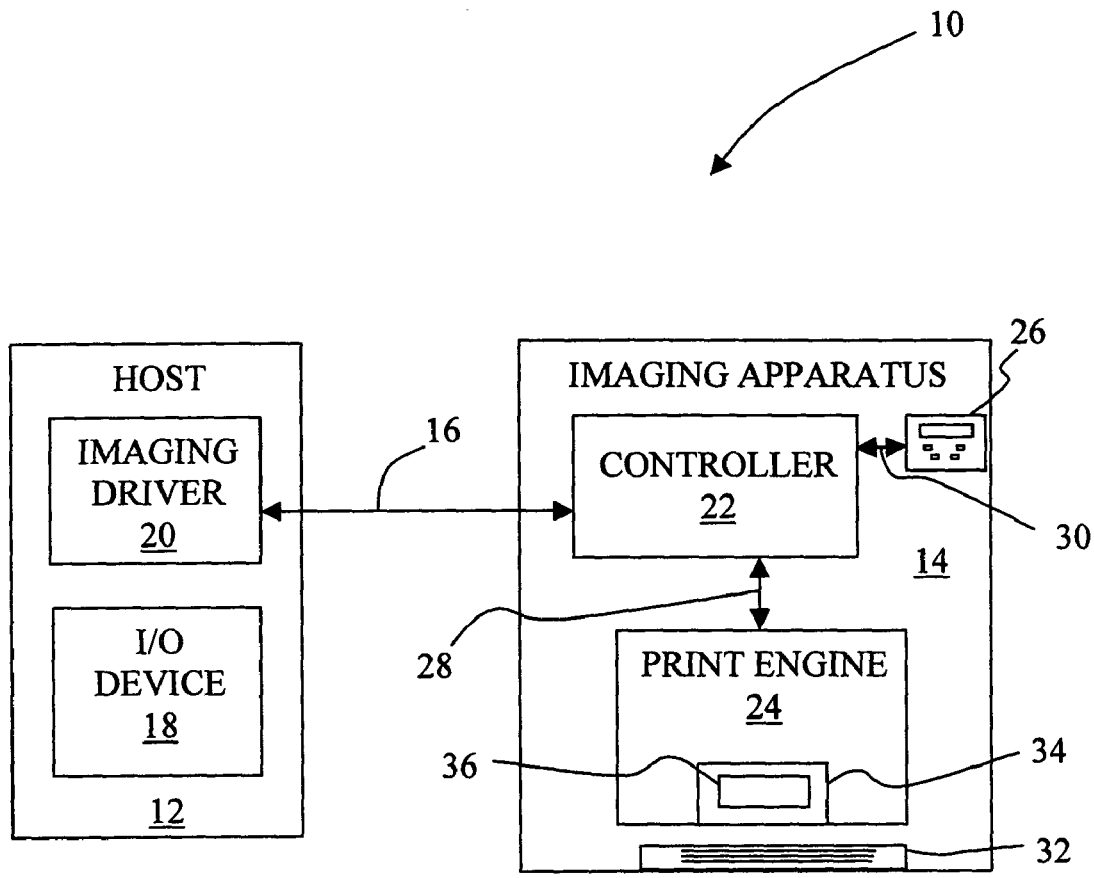
FIG. 1 is a diagrammatic representation of an imaging system embodying the present invention.

Referring now to the drawings, and particularly to FIG. 1, there is shown a diagrammatic depiction of an imaging system 10 embodying the present invention. Imaging system 10 includes a host 12 and an imaging apparatus 14. Host 12 communicates with imaging apparatus 14 via a communications link 16. Communications link 16 may be established by a direct cable connection, wireless connection or by a network connection such as for example an Ethernet local area network (LAN).

Host 12 may be, for example, a personal computer including an input/output (I/O) device 18, such as keyboard and display monitor. Host 12 further includes a processor, input/output (I/O) interfaces, memory, such as RAM, ROM, NVRAM, and a mass data storage device, such as a hard drive, CD-ROM and/or DVD units. During operation, host 12 includes in its memory a software program including program instructions that function as an imaging driver 20, e.g., printer driver software, for imaging apparatus 14. Imaging driver 20 facilitates communication between host 12 and imaging apparatus 14, and may provide formatted print data to imaging apparatus 14.

Imaging apparatus 14 can be, for example, an ink jet printer and/or copier, or an electrophotographic printer and/or copier. Imaging apparatus 14 includes a controller 22, a print engine 24 and a user interface 26.

Controller 22 includes a processor unit, memory and associated interface circuitry, and may be formed as an Application Specific Integrated Circuit (ASIC). Controller 22 communicates with print engine 24 via a communications link 28. Controller 22 communicates with user interface 26 via a communications link 30. Communications links 28 and 30 may be established, for example, by using standard electrical cabling or bus structures, or by wireless connection.

In the context of the examples for imaging apparatus 14 given above, print engine 24 can be, for example, an ink jet print engine or an electrophotographic (EP) print engine, configured for forming an image on a print medium 32, such as a sheet of paper, transparency or fabric. Imaging driver 20 is in communication with controller 22 of imaging apparatus 14 via communications link 16, and may provide formatted print data to imaging apparatus 14, and more particularly, to print engine 24. Alternatively, however, all or a portion of imaging driver 20 may be incorporated into controller 22 of imaging apparatus 14.

Figure 2:
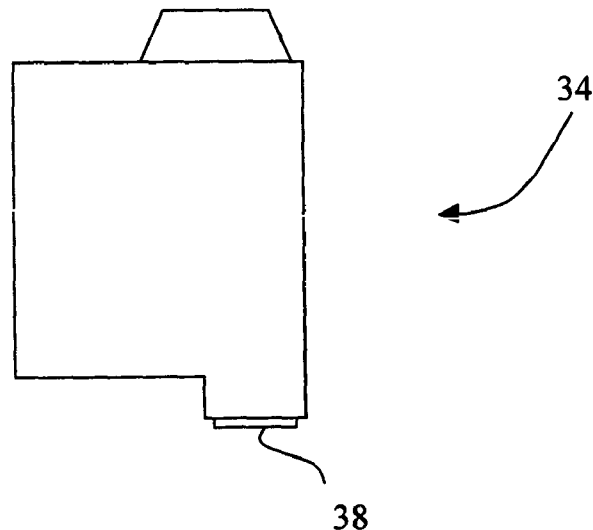
FIG. 2 is diagrammatic representation of a supply item of the imaging system of FIG. 1.

Associated with imaging apparatus 14 is a supply item 34, such as for example an ink jet printhead cartridge or an EP cartridge. Supply item 34 is received into print engine 24. Supply item 34 includes an electronic circuit 36, including interface circuitry for facilitating communications with controller 22. As shown in FIG. 2, in an embodiment wherein supply item 34 is an ink jet printhead cartridge, electronic circuit 36 may be formed as a part of the silicon on which a printhead 38 is formed.

Figures 3, 4:
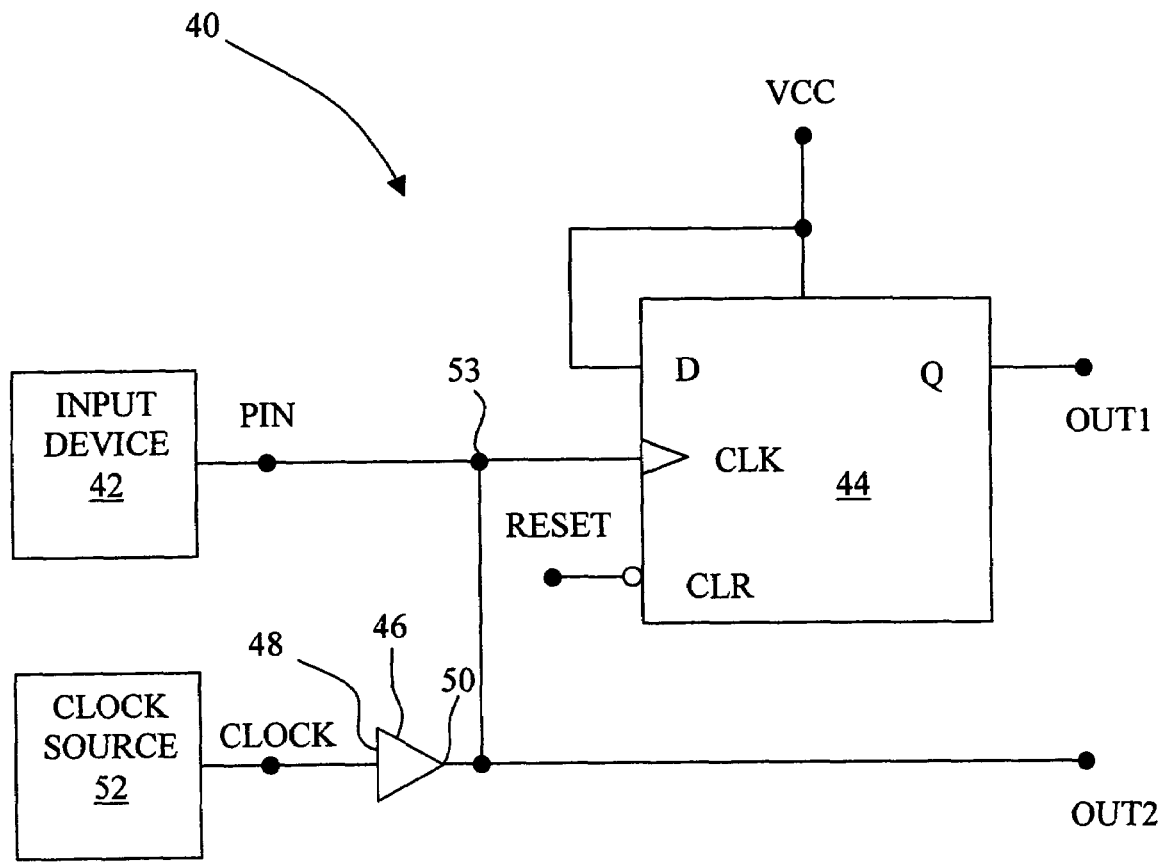
FIG. 3 is diagrammatic representation of a tri-state detection circuit embodying the present invention.
FIG. 4 is truth table associated with the tri-state detection circuit of FIG. 3.

FIG. 3 shows a tri-state detection circuit 40 that may be incorporated into host 12, imaging apparatus 14 or supply item 34. Tri-state detection circuit 40 can be used to facilitate communications between electronic apparatus. For example, tri-state detection circuit 40 may form a portion of a proprietary interface in or associated with electronic circuit 36 of supply item, or may be formed as a portion of a proprietary interface in or associated with controller 22. Other uses of tri-state detection circuit 40 may be as a portion of a peripheral interface for a peripheral device, such as a scanner, to be attached to host 12 or imaging apparatus 14. Further, it is contemplated that tri-state detection circuit 40 may serve as a mode selection circuit for printhead 38.

Tri-state detection circuit 40 includes two input ports, identified herein as input port PIN and a clock input port CLOCK, and two output ports, output port OUT1 and output port OUT2. Tri-state detection circuit 40 is used to detect each of three input states available from a tri-state input device 42 coupled to input port PIN. The three states are: logic high (1); logic low (0); and, floating, or sometimes also referred to as high impedance.

Tri-state detection circuit 40 includes a D-flip-flop 44 and a buffer 46. A clock source 52 may be included in tri-state detection circuit 40, or may provided as a separate clock input to tri-state detection circuit 40. For example, clock source 52 may be a free running clock connected to clock input port CLOCK, or may be input/output (I/O) data, such as an input/output to electronic circuit 36 of printhead 38, or a bit in address data, supplied to clock input port CLOCK.

In the circuit arrangement of tri-state detection circuit 40, D-flip-flop 44 includes an input, referred to herein as a D input; a clock input CLK; a reset input CLR; and an output, referred to herein as a Q output. The D input of D-flip-flop 44 is tied high, i.e., is connected to a voltage source VCC. The clock input CLK is coupled, e.g., connected, to input port PIN. D-flip-flop 44 operates in a traditional manner, with the level of the input signal on the D input being replicated at the Q output on the rising edge of the signal received at clock input CLK. Upon receiving a reset signal RESET at reset input CLR, the Q output goes to a logic low (0) level, and will remain at the logic low level until the next rising edge of the signal received at clock input CLK of D-flip-flop 44. The Q output is coupled to output port OUT1.

Buffer 46 has an input 48 and an output 50. Input 48 of buffer 46 is coupled, e.g., connected, to clock input port CLOCK. Output 50 of buffer 46 is coupled to the clock input CLK of D-flip-flop 44, and accordingly, to input port PIN. Output 50 of buffer 46 also is coupled to output port OUT2. Accordingly, as shown in FIG. 3, input port PIN, output port OUT2, clock input CLK of D-flip-flop 44 and buffer output 50 are coupled, e.g., connected, to a common node 53.

In one embodiment of tri-state detection circuit 40, buffer 46 is selected such that its ability to sink and source current is at least about ten times less than that of tri-state input device 42. For example, buffer 46 may be able to sink or source about 0.1 milliamps of current, whereas tri-state input device 42 may be able to sink or source about 4.0 milliamps of current. Thus, when tri-state input device 42 drives the input port PIN to ground, thereby pulling the clock input CLK of D-flip-flop 44 to ground, the D-flip-flop will not see the rising edge transition of the clocking signal supplied to the clock input port CLOCK by clock source 52.

In using tri-state detection circuit 40, it is desirable for tri-state input device 42 to provide a stable input signal to input port PIN of tri-state detection circuit 40. Also, immediately prior to reading an input at input port PIN, the Q output of D-flip-flop 44 is reset (cleared) to a low logic level (0) by application of a reset signal RESET to reset input CLR of D-flip-flop 44. The reading of an input at input port PIN occurs at the rising edge of the clocking signal supplied by clock source 52 to the clock input port CLOCK, and in turn, supplied to buffer 46. However, even if not stable, the current sinking capability of output 50 of buffer 46 will tend to mask any inadvertent low-to-high (0-to-1) transitions occurring at input port PIN of tri-state detection circuit 40.

Referring now to FIG. 4, there is shown a truth table relating the outputs at output ports OUT1 and OUT2 to each of the three possible input states of the signal supplied by tri-state input device 42 to input port PIN of tri-state detection circuit 40.

With reference to FIGS. 3 and 4, assume that the signal at input port PIN has a floating (high impedance) level, and that the Q output of D-flip-flop 44 has been reset to a low logic level (0) by application of a reset signal RESET to reset input CLR of D-flip-flop 44. When input port PIN is floating (high impedance), then D-flip-flop 44 will see at its clock input CLK the next rising edge transition of the clocking signal supplied to clock input port CLOCK, which is mirrored by output 50 of buffer 46. Accordingly, the Q output of D-flip-flop 44 will go high, which in turn is reflected as a high signal level at output port OUT1 of tri-state detection circuit 40. In this case, the output signal level at output port OUT2 is a "don't care", represented in the truth table by an X. Thus, a high logic level (1) at output port OUT1 of tri-state detection circuit 40 represents that the corresponding input state of the signal supplied by tri-state input device 42 to input port PIN is FLOATING (high impedance).

Again, with reference to FIGS. 3 and 4, assume that the signal at input port PIN has a logic high (1) level present, and that the Q output of D-flip-flop 44 has been reset to a logic low (0) level by application of a reset signal RESET to reset input CLR of D-flip-flop 44. When the signal at input port PIN is at a logic high (1), then clock input CLK of D-flip-flop 44 is clamped high and output port OUT2 is clamped high. Thus, D-flip-flop 44 will not see at its clock input CLK the next rising edge transition of the clocking signal supplied to clock input port CLOCK, and the Q output of D-flip-flop 44 will remain at a logic low (0) level. Accordingly, if output port OUT1 is at a logic low (0) level and output port OUT2 is at a logic high (1) level, then tri-state detection circuit 40 has detected that the signal supplied by tri-state input device 42 to input port PIN is a logic high (1) level.

Again, with reference to FIGS. 3 and 4, assume that input port PIN has a logic high (0) level present, and that the Q output of D-flip-flop 44 has been reset to a logic low (0) level by application of a reset signal RESET to reset input CLR of D-flip-flop 44. When input port PIN is at a logic low (0), then clock input CLK of D-flip-flop 44 is clamped low, and output port OUT2 is clamped low. Thus, D-flip-flop 44 will not see at its clock input CLK the next rising edge transition of the clocking signal supplied to clock input port CLOCK, and the Q output of D-flip-flop 44 will remain at a logic low (0) level. Accordingly, when output port OUT1 is at a logic low (0) level and output port OUT2 is at a logic low (0) level, then tri-state detection circuit 40 has detected that the signal supplied by tri-state input device 42 to input port PIN is at a logic low (0) level.

Figure 5:
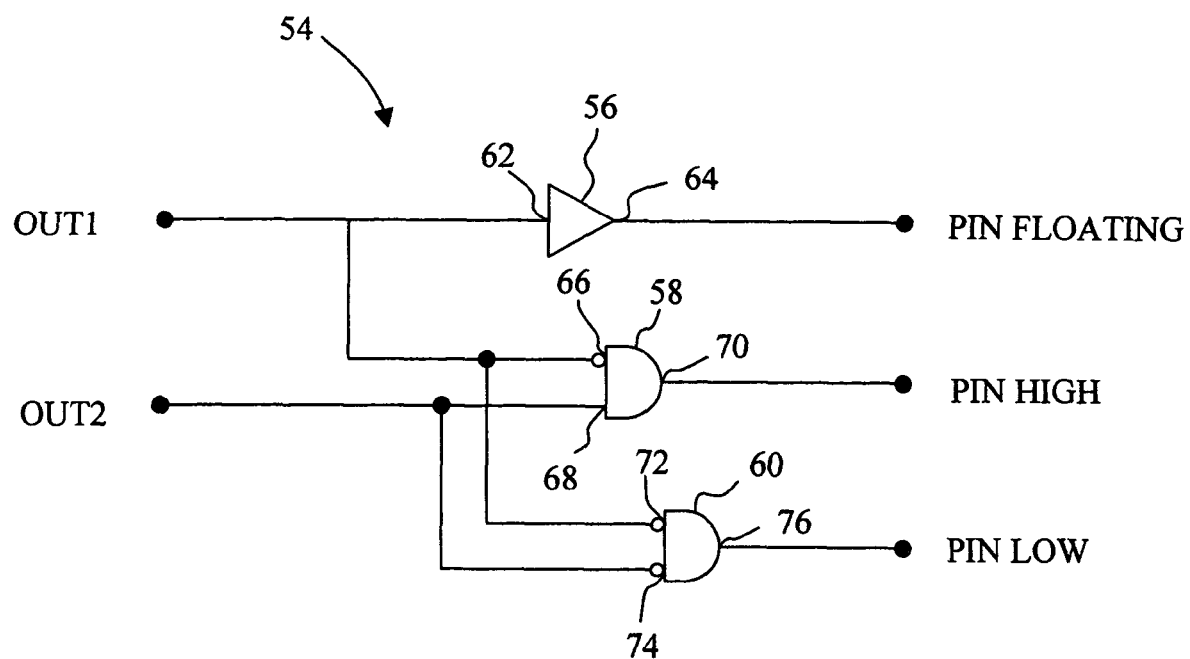
FIG. 5 is a diagrammatic representation of a decoding circuit that can be used to process the outputs of the tri-state detection circuit of FIG. 3.

FIG. 5 is a simple decoding circuit 54 that can be used to decode the outputs provided by output ports OUT1 and OUT2 of tri-state detection circuit 40. Decoding circuit 54 provides three separate outputs: PIN FLOATING, PIN HIGH and PIN LOW. For each combination of outputs from output ports OUT1 and OUT2 represented in the truth table of FIG. 4, only one of respective outputs PIN FLOATING, PIN HIGH and PIN LOW will be set to a logic high (1) level.

Decoding circuit 54 includes a buffer 56, a two-input AND gate 58 and a two-input AND gate 60. Buffer 56 includes an input 62 and an output 64. AND gate 58 includes an input 66, an input 68 and an output 70. AND gate 60 includes an input 72, an input 74 and an output 76. The bubbles at input 66 of AND gate 58 and at inputs 74, 76 of AND gate 60 signifies that the signals received on those line are inverted prior to being processed by the respective AND gates 58, 60. Each of outputs 64, 70 and 76 are connected to corresponding output ports 78, 80 and 82, wherein the output signal PIN FLOATING is present at output port 78, output signal PIN HIGH is present at output port 80 and output signal PIN LOW is present at output port 82.

Figure 6:
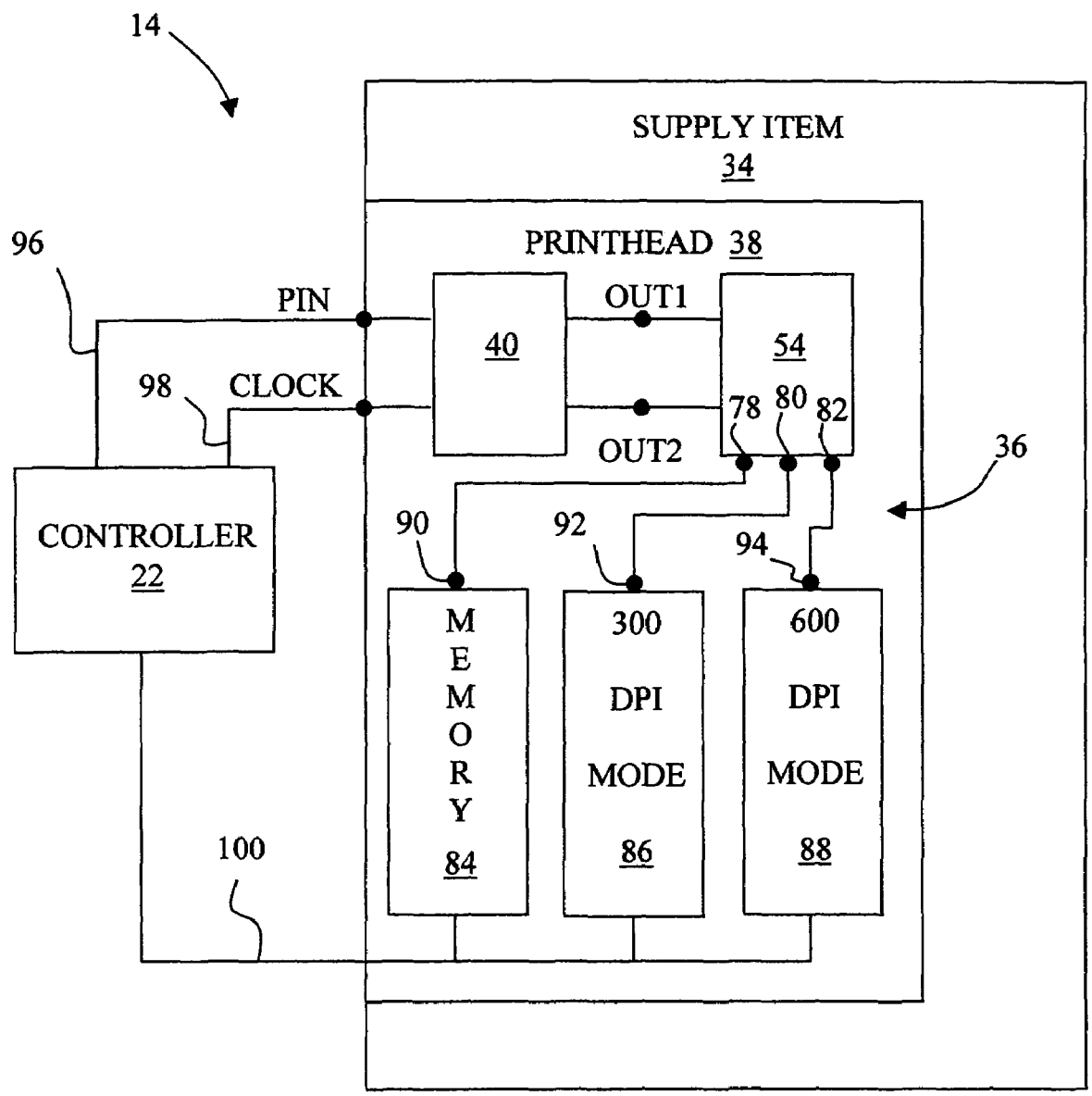
FIG. 6 is a diagrammatic representation of circuit wherein an operational mode of a supply item is selected using a tri-state input.

FIG. 6 shows a circuit formed by a portion of imaging apparatus 14 and supply item 34, such as a printhead cartridge including a printhead 38, wherein an operational mode for printhead 38 is selected based on the signal level of a tri-state input signal supplied to input port PIN. By using a tri-state input, three possible modes of operation may be readily and selectably accommodated.

As shown in FIG. 6, printhead 38 includes tri-state detection circuit 40 (see FIG. 3), decoding circuit 54 (see FIG. 5), a memory 84, 300 dpi print mode circuitry 86 and 600 dpi print mode circuitry 88. Memory 84 includes a select port 90. 300 dpi print mode circuitry 86 includes a select port 92. 600 dpi print mode circuitry 88 includes a select port 94. Output ports 78, 80 and 82 of decoding circuit 54 are respectively coupled to the select ports 90, 92, 94 of memory 84, 300 dpi print mode circuitry 86 and 600 dpi print mode circuitry 88. Thus, signals PIN FLOATING, PIN HIGH and PIN LOW may be used to select one of the devices memory 84, 300 dpi print mode circuitry 86 and 600 dpi print mode circuitry 88 based on the state, i.e., signal level, of the tri-state input signal presented at input port PIN.

In the embodiment shown, controller 22 of imaging apparatus 14 supplies a tri-state input signal to input port PIN via a communication link 96, supplies a clocking signal to input port CLOCK via a communication link 98, and supplies data to one of memory 84, 300 dpi print mode circuitry 86 and 600 dpi print mode circuitry 88 via communications link 100, which is shown as a common data bus. Each or communications links 96, 98, 100 may be wired, or wireless.

In the arrangement shown in FIG. 6, if controller 22 supplies a floating input signal to input port PIN, then output signal PIN FLOATING at output port 78 will be set at a logic high level, thereby selecting communication with memory 84 over communications link 100. If controller 22 supplies a high input signal to input port PIN, then output signal PIN HIGH at output port 80 will be set at a logic high level, thereby selecting communication with 300 dpi print mode circuitry 86 over communications link 100. If controller 22 supplies a low input signal to input port PIN, then output signal PIN LOW at output port 82 will be set at a logic high level, thereby selecting communication with 600 dpi print mode circuitry 88 over communications link 100.

With respect to the embodiment of FIG. 6, those skilled in the art will recognize that other mode devices could be substituted for the mode devices memory 84, 300 dpi print mode circuitry 86 and 600 dpi print mode circuitry 88. Also, with respect to the embodiment of FIG. 6, those skilled in the art will recognize that other tri-state detection circuits and/or decoding circuits could be substituted for either or both of tri-state detection circuit 40 and decoding circuit 54.

While this invention has been described with respect to particular embodiments, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A supply item comprising a circuit including a tri-state input port, said supply item associated with an imaging apparatus, and said supply item having at least three modes of operation, wherein a particular mode of operation of said at least three modes of operation is selected based on a signal level of a tri-state input signal supplied to said tri-state input port.

2. The supply item of claim 1, wherein said supply item is a printhead cartridge.

3. The supply item of claim 1, wherein said circuit is formed on a printhead attached to said supply item.

4. A supply item comprising a circuit including a tri-state input port, and said supply item having at least three modes of operation, wherein a particular mode of operation of said at least three modes of operation is selected based on a signal level of a tri-state input signal supplied to said tri-state input port, wherein said circuit further includes:

a clock input port for receiving a clocking signal;

a first output port;

a second output port coupled to said tri-state input port;

a D-flip-flop, said D-flip-flop having a D input, a clock input CLK, and a Q output, said D input being tied high, said clock input CLK being coupled to said tri-state input port, and said Q output port ;and a buffer having a buffer input and a buffer output, said buffer input being coupled to said clock input port, and said buffer output being coupled to said clock input CLK of said D-flip-flop.

5. The supply item of claim 4, further comprising a decoding circuit coupled to said first output port and said second output port, said decoding circuit providing three discrete outputs corresponding, respectively, to a floating level, a logic high level and a logic low level present at said tri-state input port.

6. The supply item of claim 5, wherein each of said three discrete outputs is respectively coupled to one of at least three selectable mode devices.

7. An imaging apparatus, comprising:

a controller; and a supply item including a circuit having a tri-state input port coupled to said controller, said supply item having at least three modes of operation, wherein a particular mode of operation of said at least three modes of operation is selected based on a signal level of a tri-state input signal supplied to said tri-state input port by said controller.

8. The imaging apparatus of claim 7, wherein said supply item is a printhead cartridge.

9. The imaging apparatus of claim 7, wherein said circuit is formed on a printhead attached to said supply item.

10. An imaging apparatus, comprising:

a controller; and a supply item including a circuit having a tri-state input port coupled to said controller, said supply item having at least three modes of operation, wherein a particular mode of operation of said at least three modes of operation is selected based on a signal level of a tri-state input signal supplied to said tri-state input port by said controller, wherein said circuit further includes: circuit comprising:

a clock input port for receiving a clocking signal;

a first output port;

a second output port;

a D-flip-flop, said D-flip-flop having a D input, a clock input CLK, and a Q output, said D input being tied high, said clock input CLK being coupled to said tri-state input port, and said Q output port ;and a buffer having a buffer input and a buffer output, said buffer input being coupled to said clock input port, and said buffer output being coupled to said clock input CLK of said D-flip-flop.

11. The imaging apparatus of claim 10, further comprising a decoding circuit coupled to said first output port and said second output port, said decoding circuit providing three discrete outputs corresponding, respectively, to a floating level, a logic high level and a logic low level present at said tri-state input port.

12. The imaging apparatus of claim 11, wherein each of said three discrete outputs is respectively coupled to one of at least three selectable mode devices.

* * * * *